(12) United States Patent
Marshall et al.

(10) Patent No.: US 7,281,318 B2
(45) Date of Patent: Oct. 16, 2007

(54) METHOD OF MANUFACTURING A COMPOSITE STRUCTURAL MEMBER HAVING AN INTEGRATED ELECTRICAL CIRCUIT

(75) Inventors: Joseph A. Marshall, Seattle, WA (US); Douglas B. Weems, West Chester, PA (US); Richard C. Bussom, West Chester, PA (US); David M. Anderson, Issaquah, WA (US)

(73) Assignee: The Boeing Company, Chicago, IL (US)

( * ) Notice: Subject to any disclaimer, the term of this patent is extended or adjusted under 35 U.S.C. 154(b) by 563 days.

(21) Appl. No.: 10/848,703

(22) Filed: May 19, 2004

(65) Prior Publication Data

US 2005/0257956 A1     Nov. 24, 2005

(51) Int. Cl.
*H01C 17/28* (2006.01)
(52) U.S. Cl. .................. 29/621; 29/610.1; 29/611; 29/612; 29/613; 29/620; 29/825; 29/846; 174/256; 174/260; 174/117 FF; 244/134 R; 244/134 D; 428/212; 428/220
(58) Field of Classification Search .................. 29/621, 29/610.1, 611–613, 620, 825, 846; 174/117 FF, 174/256, 260; 244/134 R, 134 D; 428/212, 428/220
See application file for complete search history.

(56) References Cited

U.S. PATENT DOCUMENTS

| | | | |
|---|---|---|---|
| 2,686,640 A * | 8/1954 | Neel, Jr. et al. | ........ 244/134 D |
| 4,352,142 A | 9/1982 | Olson | |
| 4,479,163 A | 10/1984 | Bannink, Jr. et al. | |
| 4,502,092 A | 2/1985 | Bannink, Jr. et al. | |
| 4,628,402 A | 12/1986 | Covey | |
| 4,654,747 A | 3/1987 | Covey | |
| 4,727,451 A | 2/1988 | Covey | |
| 4,789,918 A | 12/1988 | Bannink, Jr. | |
| 4,839,771 A | 6/1989 | Covey | |
| 4,866,839 A | 9/1989 | Covey | |
| 4,892,626 A | 1/1990 | Covey | |

(Continued)

FOREIGN PATENT DOCUMENTS

EP     1 450 377     8/2004

OTHER PUBLICATIONS

Katy Black, et al.; *Using Multi-Axis Grating Strain Sensors To Measure Transverse Strain and Transverse Strain Gradients In Composite Materials with Complex Weave Structures*; 7 pages; http://www.bluerr.com/papers/BRR-2002_SPIE_Vol4694_p162.pdf.

(Continued)

*Primary Examiner*—A. Dexter Tugbang
*Assistant Examiner*—Tim Phan
(74) *Attorney, Agent, or Firm*—Alston & Bird LLP

(57) ABSTRACT

A method of manufacturing a composite structural member with an integrated electrical circuit is provided. The structural member includes a plurality of layers of structural reinforcement material, and two or more electrical devices are disposed at least partially between the layers with an intermediate layer of the structural reinforcement material disposed between the electrical devices. At least one electrical bus is disposed in the structural member, and each electrical device is connected to the bus by a conductive electrode. Thus, the electrodes can extend through the intermediate layer of the structural reinforcement material to connect each of the electrical devices to one or more of the buses.

21 Claims, 6 Drawing Sheets

U.S. PATENT DOCUMENTS

| | | | |
|---|---|---|---|
| 4,897,143 A | 1/1990 | Covey | |
| 4,905,931 A | 3/1990 | Covey | |
| 4,912,594 A | 3/1990 | Bannink, Jr. et al. | |
| 4,920,449 A | 4/1990 | Covey | |
| 4,971,268 A | 11/1990 | Dobrowski et al. | |
| 5,089,325 A | 2/1992 | Covey | |
| 6,000,977 A | 12/1999 | Haake | |
| 6,035,084 A | 3/2000 | Haake et al. | |
| 6,338,455 B1 * | 1/2002 | Rauch et al. | 244/134 D |
| 6,655,218 B1 | 12/2003 | Ogisu et al. | |
| 6,868,314 B1 | 3/2005 | Frink | |

OTHER PUBLICATIONS

Patent Abstracts of Japan, vol. 1999, No. 01, Jan. 29, 1999 & JP 10 271852 (Commuter Herikoputa Senshin Gijutsu Kenkyusho:KK), Oct. 9, 1998, Abstract.

Schmidt et al., "AIAA 00-1710: Design and Manufacturing of a Second-Generation Integral Twist-Actuated Rotor Blade," *41st Structures, Structural Dynamics, and Materials Conference & Exhibit*, Apr. 3, 2000.

Search Report for PCT/US2005/016200 dated Oct. 28, 2005.

* cited by examiner

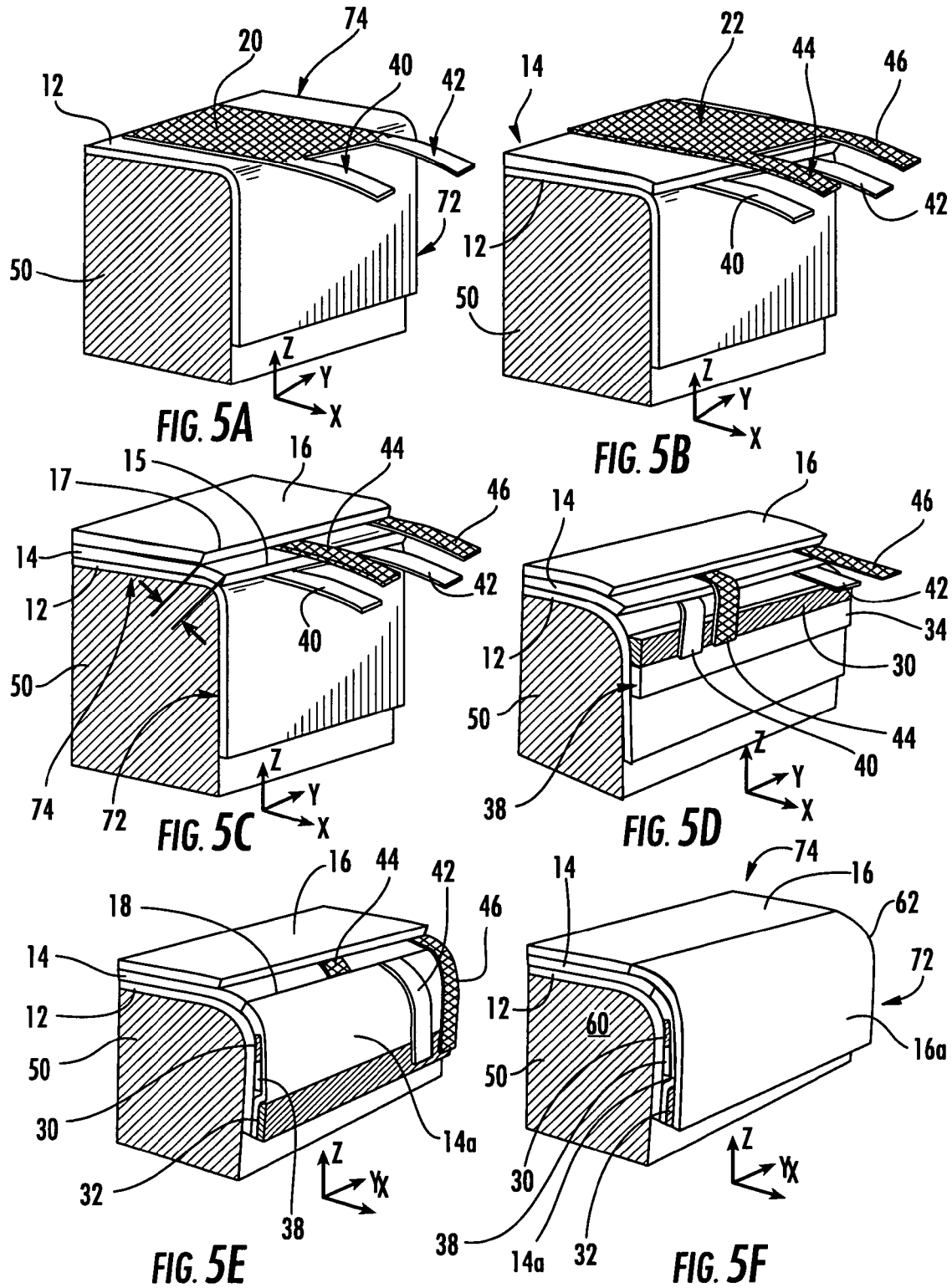

METHOD OF MANUFACTURING A COMPOSITE STRUCTURAL MEMBER HAVING AN INTEGRATED ELECTRICAL CIRCUIT

FEDERALLY SPONSORED RESEARCH OR DEVELOPMENT

This invention was made with government support under contract number NCC2-9019 awarded by the Rotorcraft Industry Technology Association, Inc. (RITA). The government may have certain rights in this invention.

BACKGROUND OF THE INVENTION

1) Field of the Invention

The present invention relates to a structural member with an integrated electrical circuit and, in particular, to a structurally integrated circuit including multiple electrical devices that are electrically connected by electrodes to one or more electrical buses.

2) Description of Related Art

Electrical devices are often used in conjunction with a structural member. For example, electrical devices such as sensors and actuators can be embedded within, mounted on, or otherwise structurally integrated with the structure of a vehicle such as an airplane, spacecraft, land vehicle, ship, and the like. Other examples of electrical devices mounted in conjunction with a structural member can include machinery, buildings, and the like. The sensors can be used to detect temperature, motion, stress, strain, damage, and the like at different locations throughout the structure. The actuators can be used to adjust various control portions of the structure such as an elevator, rudder, aileron, helicopter rotor, door, or valve. Data generated by the electrical devices is typically communicated via electrical wires from the devices to a computer or other circuit device for processing. Similarly, control signals and electrical power are typically transmitted via electrical wires from the computer, power supply, and/or other circuit device to the actuators and sensors. Thus, a network of wires is often required for controlling and monitoring the electrical devices. Each wire usually includes one or more conductive strands, for example, copper strands, which are covered with an insulative jacket. Parallel wires can be held in groups with bundle fasteners, such as cable tie straps or shrink tubing. Fasteners such as clips, ties, and the like are often used to connect the wires or bundles of wires to the structural member at successive locations along the length of the wires so that the position of the wires is maintained. In some cases, an extensive and complex network of wires may be required.

In some applications, however, it is difficult or impractical to connect the wires to the structural member. For example, the structural member may not define any interior cavities through which the wires can be passed, and the environmental conditions outside the structural member may be harsh, for example, excessively warm or cold or subject to mechanical stress, moisture, or corrosive agents. In addition, the weight and size of the wires may negatively affect the performance of the structural member. Further, in applications where the structural member undergoes significant or repeated mechanical stress, the resulting strains in the wires can break the wires regardless of whether the wires are connected to the structural member.

One illustrative example is a blade of a helicopter rotor, which is rotated quickly around a hub of the rotor. In some cases, it may be desirable to provide wires that extend along the length of the blade, for example, to monitor sensors or control actuators in or on the blade. The wires cannot be connected to the outside of the blade because of the external conditions, e.g., wind, moisture, and the like. Further, the blade undergoes significant stress due to centripetal and aerodynamic forces. If the wires are not connected successively or continuously along the length of the blade, each wire will be strained due to the inertial force that results from the rotation and vibration. On the other hand, if the wires are connected to the blade, the wires will be strained at the same rate as the blade. In either case, the stress that results in the wires can break or fatigue the wires, rendering the electrical devices ineffective.

Thus, there exists a need for a structurally integrated circuit that can be provided in a structural member for transmitting electrical signals or power. The circuit should be capable of functioning in harsh environmental conditions that include strain and temperature variations, moisture, and corrosive agents. The structurally integrated circuit should also be adaptable to structural members that do not include internal passages for wiring. The circuit should be capable of providing a complex electrical network in which multiple electrical devices are connected to one or more buses. Further, the circuit should resist failure, even when the structural member is subjected to significant or repeated stresses.

BRIEF SUMMARY OF THE INVENTION

The present invention provides a composite structural member with an integrated electrical circuit. The member includes a plurality of layers of structural reinforcement material and first and second electrical devices that are disposed at least partially between the layers of the structural reinforcement material. At least one intermediate layer of the structural reinforcement material is disposed between the electrical devices so that the electrical devices are disposed in different layers and directed toward opposite sides of the intermediate layer. Each of the layers can be formed of one or more composite laminate plies that are impregnated with a matrix material. One or more electrical buses that are disposed at least partially between the layers of the structural reinforcement material extend along the structural member. Electrodes extend between each of the electrical devices and one or more of the buses so that the electrical devices are electrically connected to the buses.

According to one embodiment of the present invention, the structural member includes at least two buses, which can be separated by spacers. First and second electrodes can connect each of the first and second electrodes to the first bus, and at least one electrode can connect the second bus to one or more of the electrical devices. Thus, the electrodes can extend through one or more of the layers of the reinforcement material, e.g., through apertures in one or more of the layers. Further, the electrical devices can be configured in a plane that is nonparallel to a plane defined by the buses, and the electrodes can extend in a nonlinear configuration to connect the electrical devices to the buses.

Each electrode and bus can include one or more tows, each of which is formed of a plurality of reinforcement fibers, and which include a conductive material such as a metallic coating on the fibers or tows.

According to another embodiment, the present invention provides a method of manufacturing a composite structural member with an integrated electrical circuit. The method includes providing a plurality of layers of structural reinforcement material and disposing first and second electrical devices at least partially between the layers of the structural reinforcement material with at least one intermediate layer therebetween. At least one electrical bus is disposed between the layers of the structural reinforcement material so that the bus extends along the structural member. First and second electrodes are connected between the bus and the first and second electrical devices, thereby electrically connecting the electrical devices to the bus.

According to one aspect of the invention, multiple buses are disposed along the structural member, and the buses can be electrically isolated by placing one or more spacers therebetween. The first bus can be connected to each of the electrical devices, and the second bus can also be connected to one or more of the electrical devices. For example, one or more of the electrodes can be disposed through the intermediate layer of reinforcement material.

BRIEF DESCRIPTION OF THE SEVERAL VIEWS OF THE DRAWINGS

Figure 1:
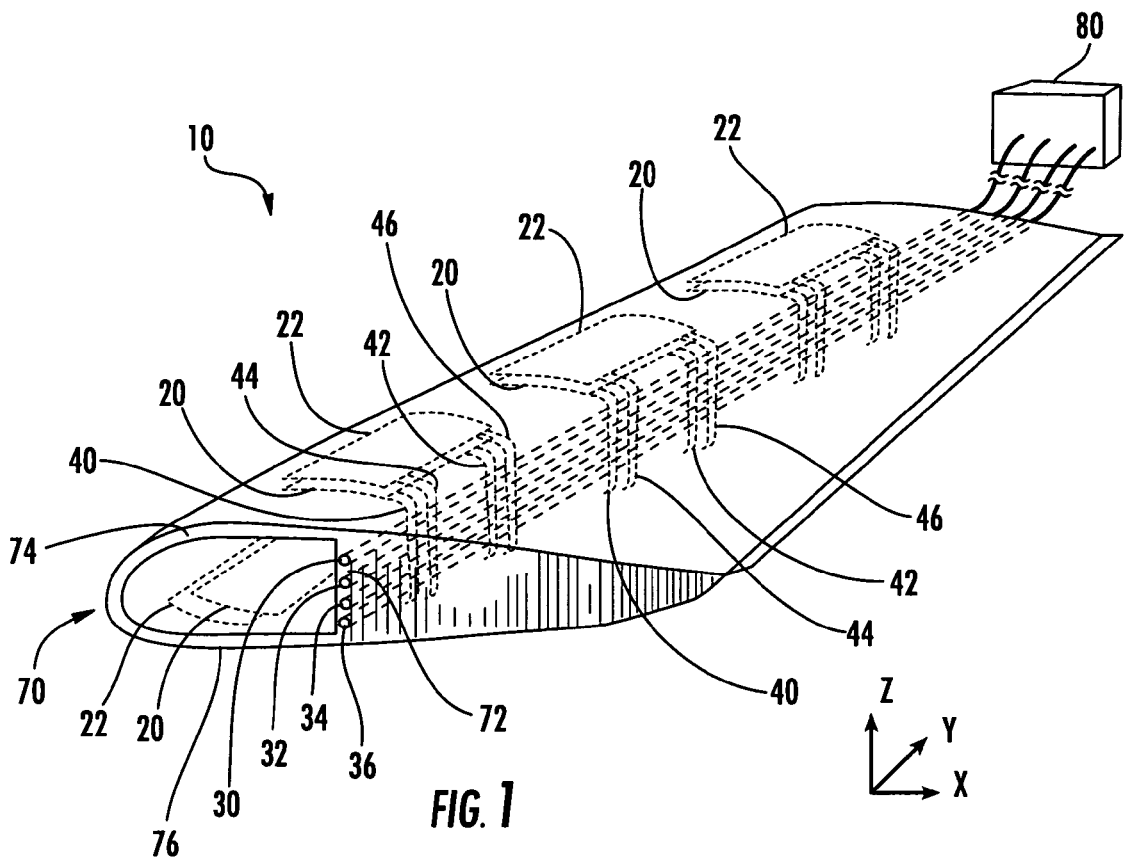
Figure 2:
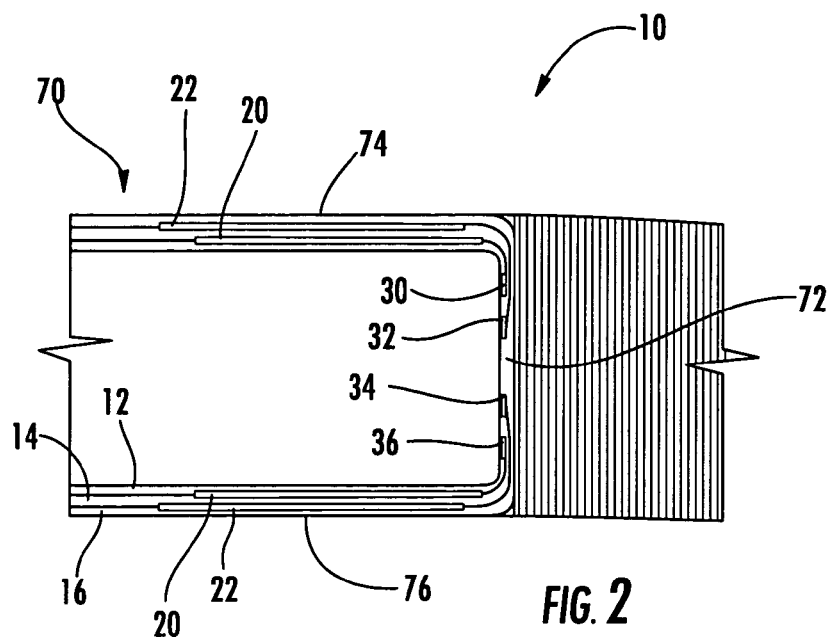
Figure 3:
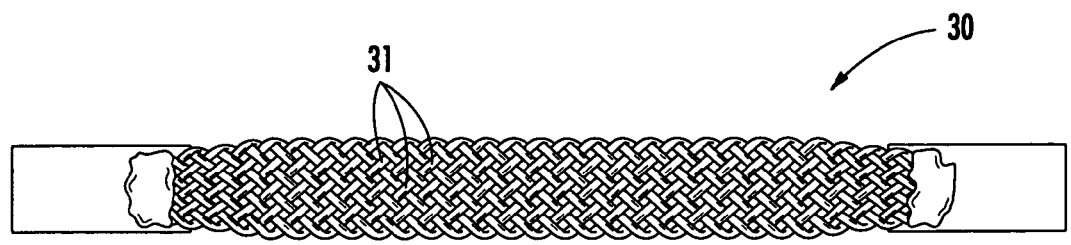
Figure 3A:
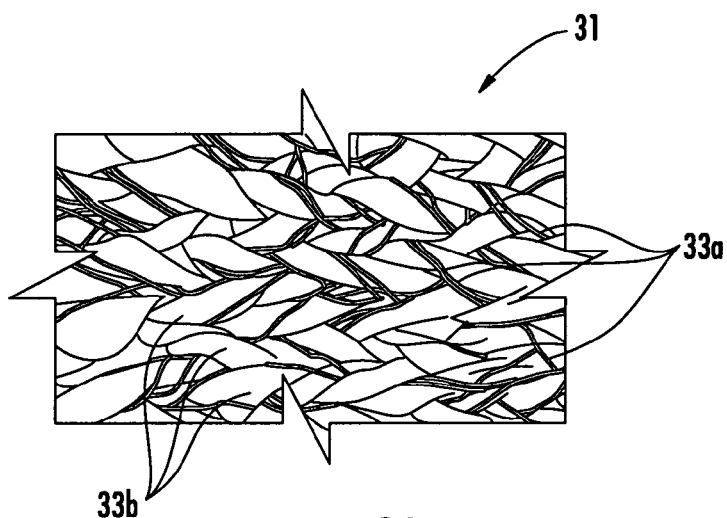
Figure 4:
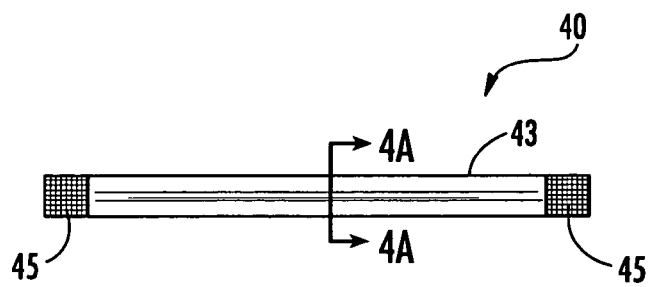
Figure 4A:
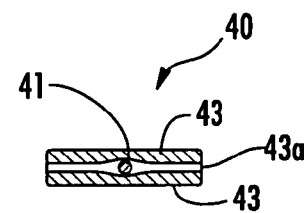
Figure 6:
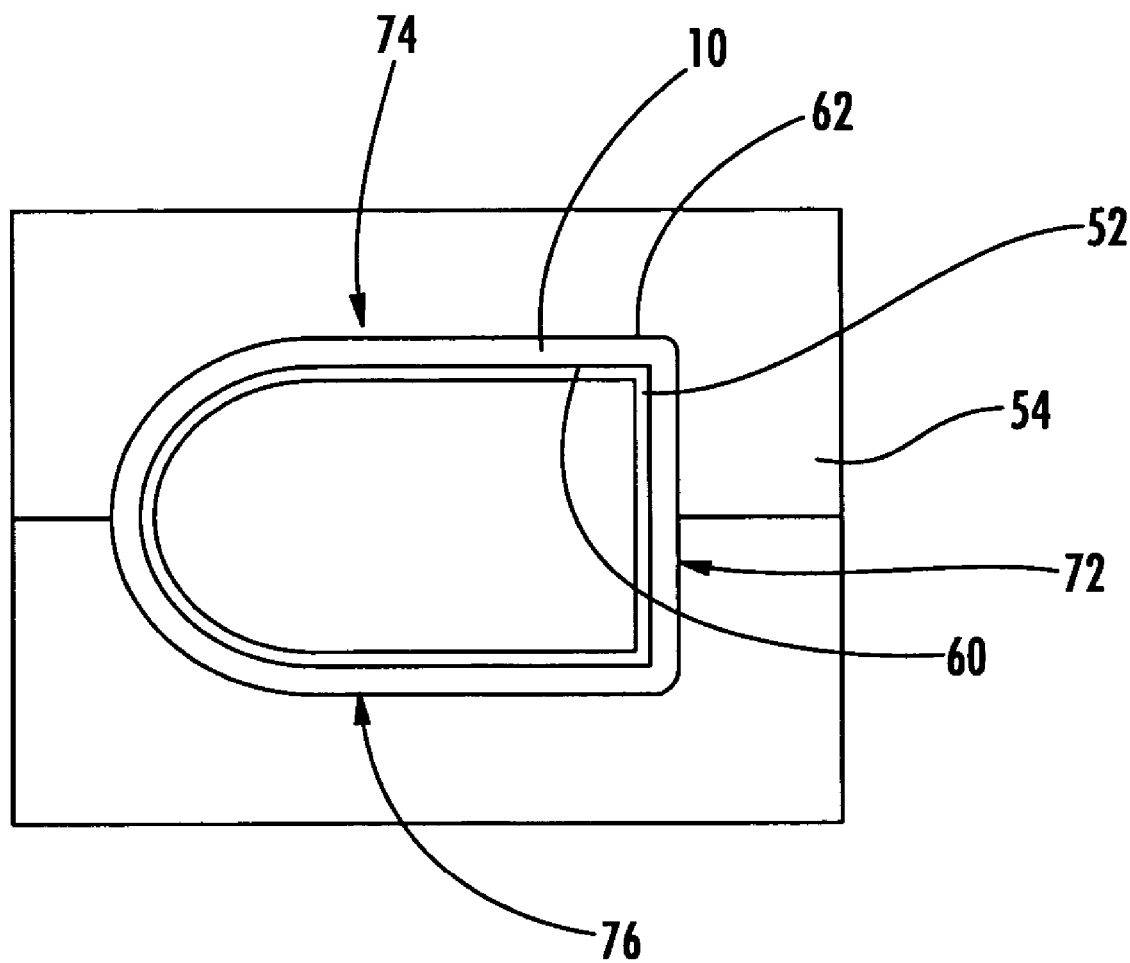
Figure 7:
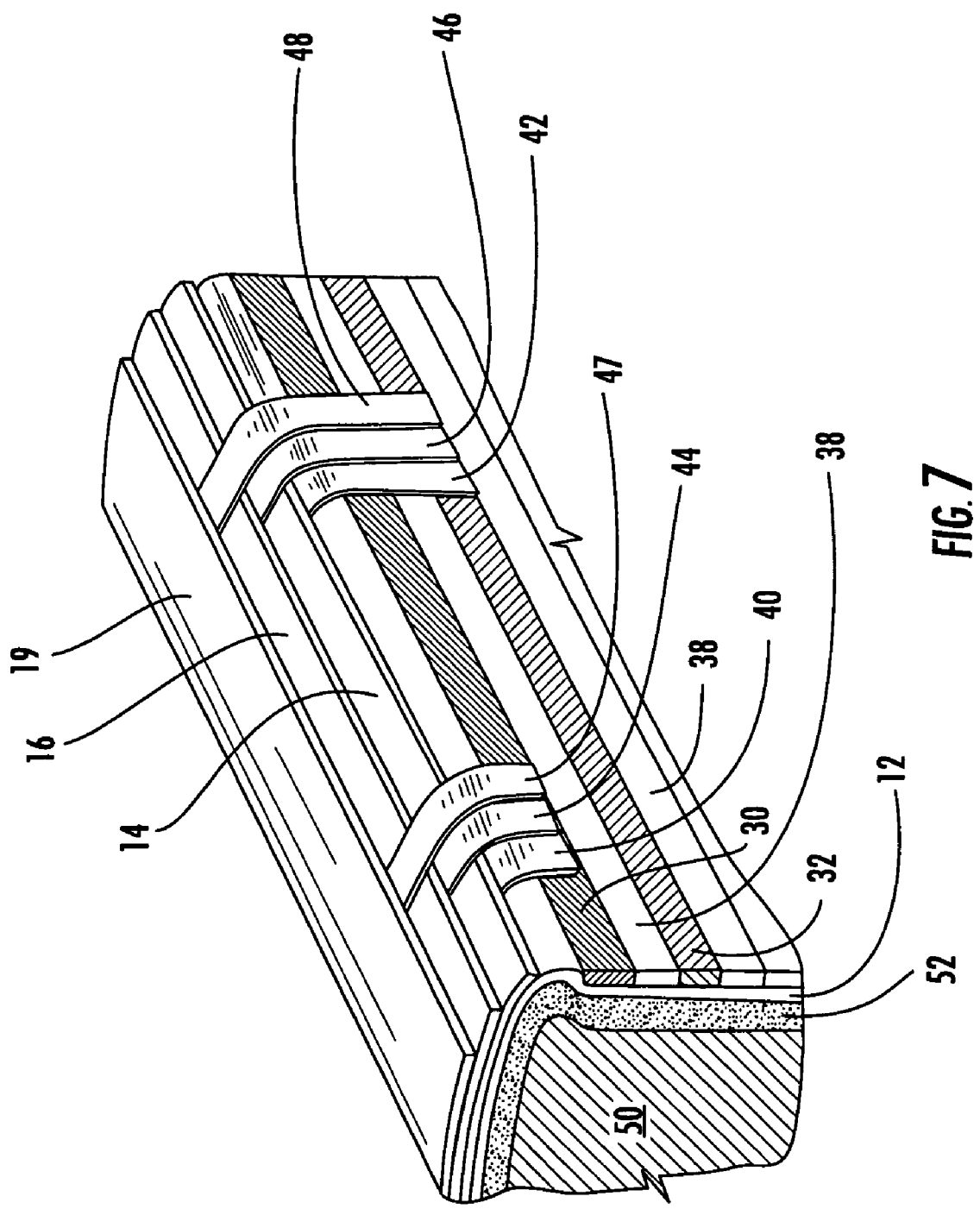
Figure 8:
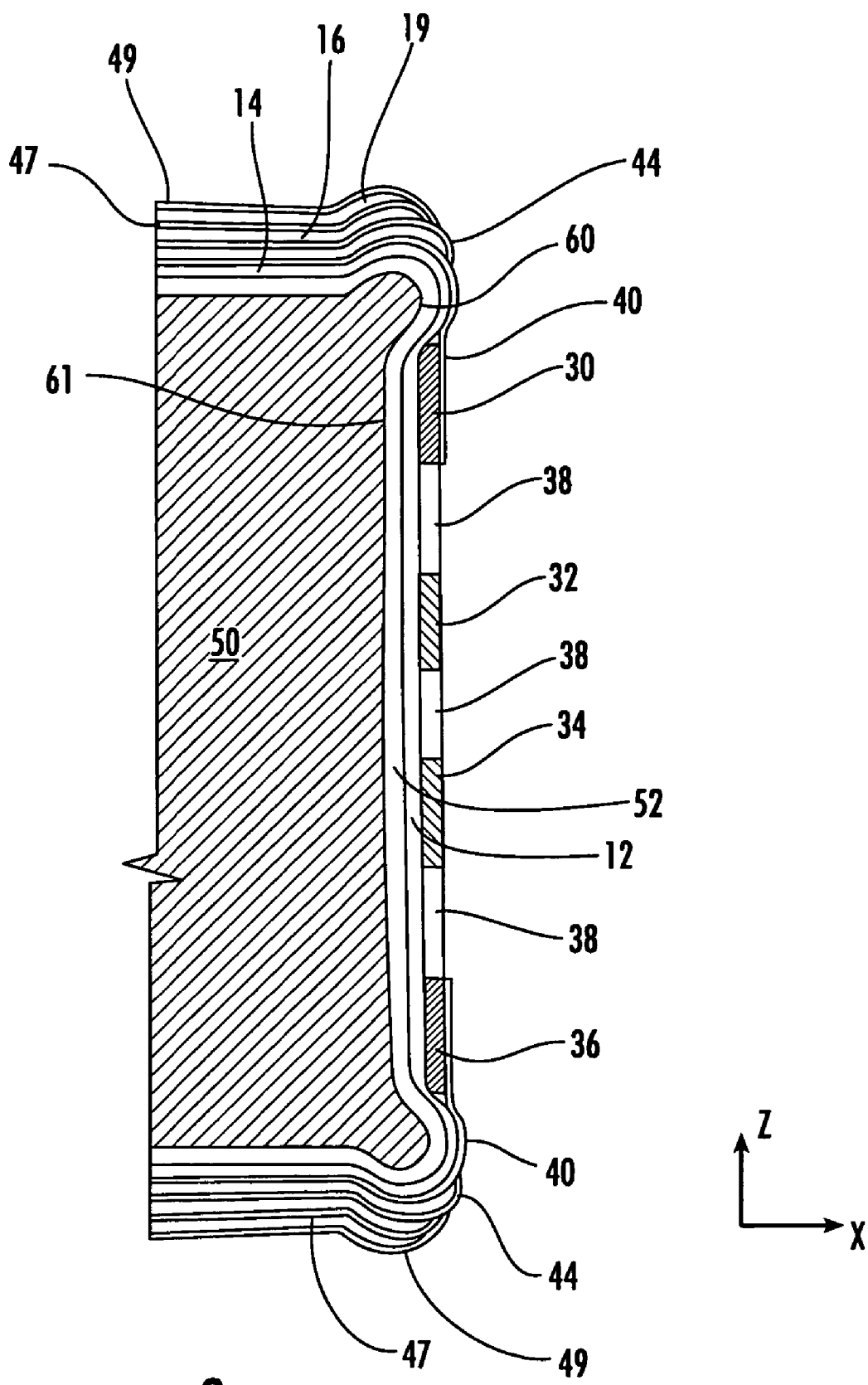

Having thus described the invention in general terms, reference will now be made to the accompanying drawings, which are not necessarily drawn to scale, and wherein:

FIG. 1 is a perspective view schematically illustrating a structural member with a structurally integrated electrical circuit according to one embodiment of the present invention;

FIG. 2 is a section view schematically illustrating the structural member of FIG. 1;

FIG. 3 is a plan view schematically illustrating one of the buses of the structural member of FIG. 1;

FIG. 3A is an enlarged view schematically illustrating a portion of the bus of FIG. 3;

FIG. 4 is a plan view schematically illustrating one of the electrodes of the structural member of FIG. 1;

FIG. 4A is a section view schematically illustrating the electrode of FIG. 4, as seen along line 4A-4A of FIG. 4;

FIGS. 5A-5F are perspective views schematically illustrating a portion of the structural member of FIG. 1 during various stages of manufacture according to one embodiment of the present invention;

FIG. 6 is a perspective view schematically illustrating a portion of the structural member of FIG. 1 being cured between a tool and an inflatable bladder according to one embodiment of the present invention;

FIG. 7 is a perspective view schematically illustrating a portion of a structural member during manufacture according to another embodiment of the present invention; and FIG. 8 is a section view schematically illustrating a portion of the structural member of FIG. 7 during manufacture.

DETAILED DESCRIPTION OF THE INVENTION

The present invention now will be described more fully hereinafter with reference to the accompanying drawings, in which some, but not all embodiments of the invention are shown. Indeed, this invention may be embodied in many different forms and should not be construed as limited to the embodiments set forth herein; rather, these embodiments are provided so that this disclosure will satisfy applicable legal requirements. Like numbers refer to like elements throughout.

Referring now to the figures, and in particular to FIG. 1, there is shown a structural member 10 with a structurally integrated electrical circuit according to one embodiment of the present invention. The term "structural member" is not meant to be limiting, and the structural member 10 can be a single component or multiple assembled members, for example, building components or machinery. Further, the structural member 10 can be used in any type of structure including vehicles such as aerospace vehicles, aircraft, marine vehicles, automobiles and other land vehicles, and the like. For example, as shown in FIG. 1, the structural member 10 is a helicopter rotor blade with four wire buses 30, 32, 34, 36 extending along the length of the member 10. In particular, the structural member 10 of FIG. 1 includes a closed-cell beam 70, which can be generally D-shaped in cross-section, and is typically referred to as a "D-spar." The D-spar 70 includes a web 72 and upper and lower flanges 74, 76. The buses 30, 32, 34, 36 are disposed in the web 72 of the D-spar 70 along a longitudinal direction of the member 10.

The structural member 10 illustrated in FIG. 1 is formed of a composite material including a plurality of layers of laminate plies of reinforcement material that are impregnated with a matrix material. The layers are indicated by reference numerals 12, 14, 16, though it is understood that any number of the layers 12, 14, 16 can be provided. For example, each illustrated layer 12, 14, 16 can include multiple individual layered members. The layers 12, 14, 16 can be formed of sheets or mats of reinforcement materials such as carbon fibers, graphite, fiberglass, or an aramides material such as Kevlar®, a registered trademark of E. I. du Pont de Nemours and Company. Alternatively, the layers 12, 14, 16 can be formed by disposing tows or filaments of the reinforcement material. In either case, the reinforcement material can be disposed separately from or in combination with the matrix material. For example, the reinforcement material can be preimpregnated with the matrix material, or the matrix material can be disposed as a distinct sheet of material. The matrix material, which can be formed of a thermoset or thermoplastic material such as a resin, is typically cured by subjecting the structural member 10 to heat and pressure so that the matrix material permeates the reinforcement material and hardens. The formation of composite materials using reinforcement and matrix materials is well known, and further explanation of such conventional formation techniques is unnecessary for an understanding of the present invention.

The structurally integrated electrical circuit is typically formed in the structural member 10 by disposing components of the circuit in the structural member 10 during the lay-up of materials of the structural member 10, i.e., before curing the structural member 10, which may include pre-cured assemblies. The circuit includes electrical devices 20, 22 that can be disposed within the structural member 10. Each of the electrical devices 20, 22 can be any of a variety of active or passive electrical devices. For example, each electrical device 20, 22 can be an actuator such as a piezo-fiber actuator pack. When used in a helicopter rotor blade, as shown in FIG. 1, actuator packs can be used in the upper and lower flanges 74, 76 to change the shape of the blade and thereby provide active aerodynamic control and vibration reduction. Alternatively, each of the electrical devices 20, 22 can be a sensor, such a strain gauge that senses deformation in the structural member 10, a light-emitting device, a computer, a processor, a power supply, or any other circuit device. The structural member 10 can include any number of the electrical devices 20, 22, each of which can be controlled independently or in combination.

The electrical circuit also includes a plurality of electrical communication devices for supplying power to, electrically grounding, communicating data with, and/or transmitting control signals to the electrical devices 20, 22. In particular, the circuit includes the one or more electrical wire buses 30, 32, 34, 36 that extend along the structural member 10, as well as a plurality of electrodes 40, 42, 44, 46 that connect each bus 30, 32, 34, 36 to the respective electrical devices 20, 22. Thus, the buses 30, 32, 34, 36 and electrodes 40, 42, 44, 46 provide electrical connections to the electrical devices 20, 22 for such functions as monitoring, actuating, and/or powering the electrical devices 20, 22.

The buses 30, 32, 34, 36 can be various types of electrical conductors, e.g., woven or braided conductive wires such as are described in U.S. application Ser. No. 10/369,906, filed Feb. 20, 2003, which application is assigned to the assignee of the present application, and which application is incorporated herein in its entirety by reference. Typically, each bus 30, 32, 34, 36 includes a plurality of tows, each tow being formed of a plurality of fibers. Some of the fibers can be nonconductive. For example, the fibers can be formed of Kevlar® or other conventional composite reinforcement materials. However, at least some of the fibers of each bus 30, 32, 34, 36 are electrically conductive. In this regard, the conductive fibers can be formed of an electrically conductive material such as metal. For example, FIGS. 3 and 3A illustrate the bus 30 according to one embodiment in which the bus 30 is formed of a plurality of braided tows 31, each tow 31 including metallic fibers 33a that are intertwined with nonconductive fibers 33b. Alternatively, the conductive fibers can be formed of a nonconductive material that is coated with an electrically conductive material such as silver, copper, gold, and the like. In other embodiments of the present invention, the buses 30, 32, 34, 36 can be formed of conventional conductive wires, such as braided or monofilament copper wire. In any case, the buses 30, 32, 34, 36 can extend longitudinally along the structural member 10 and from the structural member 10 to a circuit device such as a controller, computer, power source, or the like. For example, if the structural member 10 is a helicopter rotor blade, the buses 30, 32, 34, 36 can be electrically connected to a controller 80 mounted in the helicopter. That is, each bus 30, 32, 34, 36 can extend from the structural member 10 to the circuit device, or an intermediate connection device such as a wire or other conductive element can be provided therebetween.

The term "longitudinal" is intended to indicate generally that the buses 30, 32, 34, 36 extend generally along a direction of the structural member 10 between two or more connection points or nodes of the circuit that are spaced apart, e.g., between the controller 80 and the electrodes 40, 42, 44, 46. That is, each bus 30, 32, 34, 36 is configured in a predetermined pattern and interconnected into a circuit to obtain the desired performance, and the buses 30, 32, 34, 36 can be spaced as necessary to obtain the desired electrical conduction and isolation. However, the particular path of the buses 30, 32, 34, 36 and electrodes 40, 42, 44, 46 need not be a straight or direct path. Instead, the components may be routed in a nonlinear configuration according to a variety of design factors that are particular to the structural member 10 including, for example, the shape of the structural member 10, the placement of the electrical devices 20, 22, the anticipated variation of stress and strain throughout the structural member 10, and the like.

The electrodes 40, 42, 44, 46 can be formed of various types of electrical conductors. For example, each electrode 40, 42, 44, 46 can include one or more conductive tows that extend along a longitudinal direction of the electrode 40, 42, 44, 46. FIGS. 4 and 4A illustrate one exemplary electrode 40, which includes a conductive tow 41 that is sandwiched between plies of dielectric material 43 and/or an adhesive material 43a. Each conductive tow 41 can be formed of a plurality of fibers that can be formed of materials including, but not limited to, carbon, graphite, nylon, fiberglass, and aramids such as Kevlar® fibers. A conductive coating can be provided on the tow 41, such as a coating of conductive material such as silver, nickel, gold, copper, beryllium, aluminum, and alloys thereof. The electrode 40, 42, 44, 46 can also include contacts 45 at the opposite ends of the tow 41, such as electrically conductive pads formed of fabric plated with a conductive metal for connecting the electrode 40, 42, 44, 46 to one of the buses 30, 32, 34, 36, one of the electrical devices 20, 22, and the like.

Each of the dielectric plies 43 is configured to electrically insulate at least a portion of the tow 41. The plies 43 can be formed of a variety of dielectric materials, which can be reinforced or non-reinforced. For example, the plies 43 can be formed of a flexible film, such as Kapton® polyimide film, a registered trademark of E. I. du Pont de Nemours and Company, or another non-reinforced or reinforced dielectric material. The plies 43 can be subjected to a curing operation before being integrated with the structural member 10, or the electrodes 40, 42, 44, 46 can be disposed in the structural member 10 in an uncured state and subsequently co-cured with the structural member 10. Such electrodes are further described in U.S. application No. 10/848,655, titled "STRUCTURALLY INTEGRABLE ELECTRODE AND ASSOCIATED ASSEMBLY AND FABRICATION METHOD," filed concurrently herewith, assigned to the assignee of the present application, and which application is incorporated herein in its entirety by reference. Alternatively, the electrodes 40, 42, 44, 46 can be formed of other electrically conductive members. For example, each electrode 40, 42, 44, 46 can have a structure similar to the buses 30, 32, 34, 36, or the electrodes 40, 42, 44, 46 can be formed of conventional electrical wires or the like.

FIGS. 5A-5F illustrate a portion of the structural member 10 of FIG. 1 during successive stages of manufacture according to one embodiment of the present invention. In particular, a portion of the web 72 and one of the flanges 74 of the D-spar portion 70 of the structural member 10 are illustrated in FIGS. 5A-5F. As shown in FIG. 5A, the first layer 12 of the reinforcement material of the structural member 10 is disposed on a tool 50 that generally defines an inner mold line, or inner contour, of a space in the D-spar portion 70. The first layer 12 can include one or more sheets of the reinforcement, dielectric material. (Alternatively, a conductive or semi-conductive reinforcement material can be placed alone or in combination with the second layer 14 of dielectric material to form an equivalent first layer 12.) The first layer 12 can include one or more sheets of the reinforcement material. The first electrical device 20 is disposed on the first layer 12, in a position corresponding to the upper flange 74 of the rotor blade. Electrodes 40, 42 are connected to the first electrical device 20, either before or after electrical device 20 is disposed on the first layer 12. The second layer 14 of the reinforcement material is disposed over the first electrical device 20, and the second electrical device 22 is disposed on the second layer 14, with the electrodes 44, 46 connected to the second electrical device 22. The electrodes 44, 46 extending from the second electrical device 22 are typically offset relative to the electrodes 40, 42 of the first electrical device 20, e.g., in the y-direction as illustrated, thereby improving the electrical isolation between the electrodes 40, 42, 44, 46 of the different electrical devices 20, 22. Offsetting electrodes also offsets the actuator packs in the y-direction to provide a more smoothly tapering geometrical transition of the structural lay-up. As shown in FIG. 5C, the third layer 16 of the reinforcement material is disposed over the second electrical device 22.

Any number of the electrical devices 20, 22 can be disposed on the structural member 10. For example, additional electrical devices can be disposed between the first and second layers 12, 14 of the reinforcement material, e.g., at positions offset from the first electrical device 20 in the y-direction as illustrated in FIG. 1. Further, additional electrical devices 20, 22 can be provided on the third layer 16, with additional reinforcement layers disposed therebetween, to form a stacked configuration of three or more electrical devices 20, 22. The second and third layers 14, 16 as well as any subsequent layers of the reinforcement material can define staggered edges 15, 17, i.e., such that the layers 14, 16 extend to different positions in the x-direction, as shown in FIG. 5C. A small offset may be imposed on layer 16 and subsequent layers to provide a smooth tapering geometrical transition of the structural lay-up.

As illustrated in FIG. 5D, the first bus 30 is disposed on the first layer 12, and a spacer 38 can be disposed with the first bus 30. The spacer 38 can be formed of a rigid, dielectric material such as pre-cured composite fiberglass, such that the spacer 38 can provide a rigid path along which the first bus 30 is disposed for supporting the first bus 30. Some of the electrodes 40, 42, 44, 46 are selectively connected to the first bus 30. That is, any of the electrodes 40, 42, 44, 46 from the electrical devices 20, 22 stacked in different layered positions can be bent into contact with the bus 30. For example, one of the electrodes 40, 44 that are connected to each of the electrical devices 20, 22 can be connected to the first bus 30. In some cases, each of the electrodes 40, 44 that are connected to the first bus 30 can define different lengths so that the electrodes 40, 44 extend from the respective electrical devices 20, 22 in the positions in the layers 12, 14, 16 of the reinforcement material to the bus 30 with sufficient overlap for forming a connection therebetween. That is, each of the electrodes 40, 42, 44, 46 extending from each electrical device 20, 22 can define a length that is sufficient for extending to the respective bus 30, 32. In some cases, the electrical devices 20, 22 are disposed generally parallel to a first plane, the buses 30, 32, 34, 36 generally define a second, oblique plane, and the electrodes 40, 42, 44, 46 are curved with a first end generally parallel to the electrical devices 20, 22 and a second end generally parallel to the buses 30, 32, 34, 36. Thus, the electrical devices 20, 22 can be disposed in a predetermined configuration for performing a desired function in the structural member 10, while the buses 30, 32, 34, 36 can be disposed to achieve electrical isolation therebetween, facilitate manufacture, or the like. The fact that the devices 20, 22 are located on a different plane than the buses 30, 32, 34, 36 is a capability provided by this invention but not a necessary part of the invention.

Thereafter, an additional portion 14a of the second layer 14 of the reinforcement material is disposed over the first bus 30 and the connections between the first bus 30 and the electrodes 40, 44. The additional portion 14a may be a continuous extension of the first layer 14 or may be a separate piece that could have a different material and thickness than the rest of the first layer 14 and may or may not contact the rest of the first layer 14. The second bus 32 is disposed generally parallel to the first bus 30 and opposite the spacer 38 from the first bus 30 such that the spacer 38 electrically isolates the two buses 30, 32. In embodiments in which more than two buses 30, 32, 34, 36 extend along the structural member 10, as illustrated in FIG. 1, spacers 38 can be provided between each of the electrodes 40, 42, 44, 46. For example, spacers 38 can be provided between the second and third buses 32, 34 or between the third and fourth buses 34, 36 to electrically isolate the buses 30, 32, 34, 36. Thus, the spacers 38 can separate the buses 30, 32, 34, 36 and also function to keep inner structural plies of the layers 14, 16 relatively straight and flat in the inner surface of the web 72 of the structural member 10. Each spacers 38 can be formed of a number of layers of dielectric laminate that are stacked to approximately the same thickness of the buses 30, 32, 34 and 36. The spacers 38 are compacted, cut, and cured. The spacers 38 can be pre-cured prior to being placed in the lay-up of the structural member 10 or they can be cured during the final cure of the structural member 10.

As shown in FIG. 5E, some of the electrodes 40, 42, 44, 46 are selectively connected to the second bus 32. For example, one of the electrodes 42, 46 connected to each of the electrical devices 20, 22 can be connected to the second bus 32, in a manner similar to the connections between the electrodes 40, 44 and the first bus 30 described above. The electrodes 42, 46 can define different lengths to accommodate the different distances from each electrical device 20, 22 to the second bus 32. As shown in FIG. 5F, an additional portion 16a of the third layer 16 of the reinforcement material is disposed over the electrodes 42, 46 and the second bus 32. The additional portion 16a may be a continuous extension of the second layer 16 or may be a separate piece that could have a different material and thickness than the rest of the second layer 16 and may or may not contact the rest of the second layer 16.

The connections between the electrodes 40, 42, 44, 46 and the electrical devices 20, 22 and between the electrodes 40, 42, 44, 46 and each bus 30, 32, 34, 36 can be formed by welding, adhering, or otherwise connecting the members. For example, a conductive epoxy can be disposed between each electrode 40, 42, 44, 46 and the respective electrical device 20, 22 or bus 30, 32, 34, 36. In some cases, each connection can be a solder-like bond that is formed by heating and subsequently cooling the members, and such heating can be provided as part of the curing operation of the structural member 10 or separately before the structural member 10 is cured. Alternatively, the electrodes 40, 42, 44, 46 can be connected by other materials or by a device such as a mechanical connector.

Each of the layers 12, 14, 16 can be formed of the same or different reinforcement materials. Typically, each layer 12, 14, 16 disposed between members of the electrical circuit has sufficient electrical and dimensional properties to prevent electrical communication therethrough. For example, the second layer 14 can be sufficiently dielectric to prevent electrical conduction between the electrodes 40, 42, 44, 46 of the first and second electrical devices 20, 22, even when the electrodes 40, 42, 44, 46 carry high voltages and/or high currents.

The electrodes 40, 42, 44, 46 can extend through one or more of the layers 12, 14, 16 to positions defined between any of the different layers 12, 14, 16. For example, as illustrated in FIGS. 5C and 5E, the electrode 44 connected to the second electrical device 22 extends from the electrical device 22, which is between the second and third layers 14, 16, through the second layer 14 to the first bus 30, which is between the first and second layers 12, 14. The electrode 42 is connected to the first electrical device 20, which is between the first and second layers 12, 14, and extends through the second layer 14 to the second bus 32, which is between the second and third layers 14, 16. Similarly, other electrical devices 20, 22 can be disposed in any position among the stacked layers 12, 14, 16 of reinforcement material, and each electrical device 20, 22 can be connected to one or more buses 30, 32, 34, 36 that are disposed between the corresponding layers 12, 14, 16 or different layers of the reinforcement material. Each of the layers 12, 14, 16 can be disposed in multiple portions, e.g., as described above in connection with the second and third layers 14, 16 that include portions 14a, 16a, respectively. Thus, each layer 12, 14, 16 can define one or more apertures 18 through which the electrodes 40, 42, 44, 46 can extend. The aperture 18 illustrated in FIG. 5E is a continuous slit through the second layer 14 that completely separates portion 14a from the rest of the layer 14. Alternatively, the aperture can instead be a local, discrete hole through the layer 14 such that each of the layers 12, 14, 16 can be disposed as a single portion that defines one or more apertures through which the electrodes 40, 42, 44, 46 and/or the buses 30, 32, 34, 36 can extend.

With the structural member 10 assembled as shown in FIG. 5F, the structural member 10 can be cured by heat and pressure to form the structural member 10 as a unified structure. For example, the structural member 10 can be cured in an autoclave according to a temperature and pressure schedule that is conventionally used for curing composite structures. In some cases, the structural member 10 can be disposed in a vacuum bag, i.e., a bag or bladder that is evacuated, during the curing process. Further, as shown in FIG. 6, a pressurized bladder 52 can be placed inside the D-spar used to provide a compressive force on the interior of structural member 10, e.g., by disposing the bladder 52 within the structural member 10 and inflating the bladder 52 to urge the structural member 10 outward against a rigid tool 54. If any of the electrical devices 20, 22, the buses 30, 32, 34, 36, and/or the electrodes 40, 42, 44, 46 include curable components, these components can be cured before lay-up with the rest of the structural member 10. Alternatively, any of the electrical devices 20, 22, buses 30, 32, 34, 36, and/or electrodes 40, 42, 44, 46 can be co-cured with the structural member 10. Similarly, the spacers 38 and select layers 12, 14, 16 of the reinforcement material can be pre-cured or partially pre-cured, or these members can be cured with the rest of the structural member 10.

The structural member 10 can be cured while disposed on the tool 50. In addition, or alternative, the structural member 10 can be cured on another tool that defines another surface of the member. For example, as illustrated in FIG. 5F and 6, the structural member 10 defines inner and outer mold lines 60, 62 i.e., an inner contour surface 60 corresponding to the tool 50 and an outer contour surface 62 opposite thereto. After the structural member 10 is configured on the tool 50, the tool 54 can be configured against the outer mold line 62 of the member 10 to urge the outer mold line 62 of the structural member 10 to a desired configuration during the curing operation. Further, in some cases, the structural member 10 can be transferred to the outer tool 54 and cured without the use of the inner tool 50. For example, as shown in FIG. 6, the first tool 50 can be replaced with the inflatable bladder 52 that is disposed against the inner mold line 60 of the structural member 10 and pressurized for the curing operation such that the structural member 10 is compressed during curing.

If the structural member 10 is to be compressed between a rigid tool and a non-rigid tool, such as the rigid outer tool 54 and the non-rigid bladder 52, each of the electrodes 40, 42, 44, 46 can be disposed between the rigid tool 54 and the respective bus 30, 32, 34, 36 to which the electrode 40, 42, 44, 46 is connected. For example, as shown in FIGS. 5D and 5E, each electrode 40, 42, 44, 46 is connected to a respective one of the buses 30, 32, 34, 36 and disposed between the respective bus 30, 32, 34, 36 and the outer mold line 62, where the rigid tool 54 is typically located. The structural member 10 is typically compressed throughout during curing. However, while compression proximate to the rigid tool 54 can be relatively uniform, compression proximate to the inflatable bladder 52 can be nonuniform, i.e., the amount of compression during curing can vary throughout the member 10. For example, the relative incompressibility of the buses 30, 32, 34, 36 relative to the layers 12, 14, 16 of reinforcement material can cause the inner mold line 60 to change shape during compression. If each electrode 40, 42, 44, 46 is positioned between the respective bus 30, 32, 34, 36 and the rigid tool 54 at the outer mold line 62, the rigid tool 54 tends to support the electrode 40, 42, 44, 46 during curing and prevent the electrode 40, 42, 44, 46 from being excessively or sharply bent during curing.

The tools 50, 54 can define a variety of contours according to the desired shape of the finished structural member 10. Further, the tools 50, 54 can define contours to accommodate the difference in the number and thickness of the components layered between the inner and outer mold lines 60, 62 of the structural member 10 in different portions of the structural member 10. For example, the tool 50 can define contours at the inner mold line 60 corresponding to the placement of the buses 30, 32, 34, 36. Tool 50 can define a contour such that after all plies have been placed and compacted, the outer definition of the plies will nearly conform to the inner mold line of tool 54. This allows the minimization of movement in the plies and embedded wiring/electrodes when the internal bladder is inflated and puts pressure on the laminate layers, as the tool 54 constrains the opposite side.

According to one embodiment of the present invention, the layers 12, 14, 16 of reinforcement material of the structural member 10 are formed of a composite material including fibers or tows that are impregnated with a matrix of a cured resin. The fibers or tows can be disposed individually or as preformed laminar sheets of material. In any case, each of the electrical devices 20, 22, the buses 30, 32, 34, 36, and/or the electrodes 40, 42, 44, 46 can be structurally integrated with the structural member 10. For example, each of the electrical devices 20, 22, buses 30, 32, 34, 36, and electrodes 40, 42, 44, 46 can be embedded between the reinforcement materials of a composite structural member 10 as illustrated in FIG. 2. Typically, the components are embedded into the structural member 10 before the composite material of the structural member 10 is cured so that as the structural member 10 is cured, each of the components is integrated with the structural member 10. Further, in some cases, the components can include tows, curable resins, or other composite structural materials that can be compatible with the composite materials of the structural member 10 so that the components can form a continuous structure with the structural member 10.

Thus, the electrodes 40, 42, 44, 46 and buses 30, 32, 34, 36 can be partially or completely embedded or encapsulated in the material of the structural member 10, and during operation of the structural member 10, the electrodes 40, 42, 44, 46 and buses 30, 32, 34, 36 can be subjected to substantially the same strains as the structural member 10. Holes may be drilled into the structural member 10 and through or up to the electrodes 40, 42, 44, 46 and buses 30, 32, 34, 36 to gain electrical access. For access to the buses 30, 32, 34, 36 the holes can be drilled through the D-spar web at one end. Alternatively, the electrodes 40, 42, 44, 46 and buses 30, 32, 34, 36 can be gradually transitioned from fully embedded ply to the upper surface ply for external access to the electrical wiring. Typically, the tows or other components of the electrodes 40, 42, 44, 46 and buses 30, 32, 34, 36 are formed of a material that is strain-compatible with the reinforcement material of the structural member 10 so that the electrodes 40, 42, 44, 46 and buses 30, 32, 34, 36 are unlikely to break or otherwise fail during operation of the structural member 10. For example, the electrodes 40, 42, 44, 46 and buses 30, 32, 34, 36 can be formed of a material that is about as strong or compliant as, or stronger or more compliant than, the reinforcement material of the structural member 10. For example, each electrode and/or bus can have a tensile strength, shear strength, toughness, modulus of elasticity, or other physical characteristic that meets or exceeds the corresponding characteristic of the reinforcement material of the structural member 10. In some embodiments, the components can be integrated with a structural member 10 formed of other conventional materials including polymers, metals, and the like. Further, the electrical devices 20, 22, electrodes 40, 42, 44, 46, and buses 30, 32, 34, 36 can be secured to the structural member 10 in other alternative manners, such as by bonding the components thereto with adhesive, mechanical connectors, and the like.

FIG. 7 illustrates the structural member 10 according to another embodiment of the present invention in which three electrodes 40, 44, 47 extend from electrical devices (not shown) disposed between multiple layers 12, 14, 16, 19 of the structural material. The three electrodes 40, 44, 47 are connected to the first bus 30, and the first bus 30 is separated from the second bus 32 by one of the spacers 38. Electrodes 42, 46, 48 also extend from the electrical devices and are configured to be connected to the second bus 32. For purposes of illustrative clarity, the electrodes 42, 46, 48 are positioned against the second bus 32 as the electrodes 42, 46, 48 would typically be configured for connection thereto. However, structural material such as portions 14a, 16a is typically disposed between the first bus 30 and the electrodes 42, 46, 48 before the electrodes 42, 46, 48 are connected to the second bus 32 to prevent electrical communication between the first bus 30 and the electrodes 42, 46, 48. As also shown in FIG. 7, the structural member 10 can be disposed on the bladder 52, with the tool 50 opposite thereto, such that the tool 50 can be removed and the bladder 52 inflated during the subsequent curing operation. In addition, the edges of the layers 14, 16, 19 are spaced apart so that the thickness of the structural material tapers at the bend in the structural member 10.

While only two of the buses 30, 32 are illustrated in FIG. 7, it is understood that the electrodes can be connected to any number of the buses. For example, as shown in FIG. 8, the four buses 30, 32, 34, 36 are disposed on the first layer 12 of the structural material. Four electrodes 40, 44, 47, 49 are disposed sequentially on the first, second, third, and fourth layers 12, 14, 16, 19 of the structural material in the upper flange 74, with each of the electrodes 40, 44, 47, 49 being connected to the first bus 30. Similarly, four electrodes 40, 44, 47, 49 are disposed sequentially on the first, second, third, and fourth layers 12, 14, 16, 19 of the structural material in the lower flange 76, with each of the electrodes 40, 44, 47, 49 being connected to the fourth bus 36. Additional electrodes (not shown) can be connected to each of the buses 30, 32, 34, 36 such that any of the electrical devices are connected to any of the buses 30, 32, 34, 36. For example, in some embodiments, one or more of the buses 30, 32, 34, 36 can be connected to electrical devices in both flanges 74, 76. FIG. 8 also illustrates the contoured configuration of the inner mold line 60 as defined by the tool 50. That is, the tool 50 is contoured to define a recess or channel 61 so that the thickness of the buses 30, 32, 34, 36 and the spacers 38 can be accommodated in the web 72 without excessive bulging or otherwise undesired reconfiguring of the outer mold line 62.

While the buses 30, 32, 34, 36 and electrodes 40, 42, 44, 46, 47, 48, 49 discussed above are described as being electrically conductive, each of the elements can alternatively be configured to otherwise conduct or transmit energy. For example, each of the various buses and electrodes of the present invention can include fiber optic fibers or other members that are configured to optically conduct, e.g., such as for transmit light for communicating a signal to and/or from devices disposed throughout the structural member 10. While fiber optic fibers can be disposed in the buses and electrodes and subsequently in the structural member 10 in a manner generally similar to that described above, the connections between the optic fibers and the buses, devices, and the like are configured to transmit light.

Many modifications and other embodiments of the invention set forth herein will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method of manufacturing a composite structural member with an integrated electrical circuit, the method comprising:
   providing a plurality of layers of structural reinforcement material;
   disposing first and second electrical devices at least partially between the layers of the structural reinforcement material with at least one intermediate layer of the structural reinforcement material disposed between the electrical devices so that the electrical devices are disposed in different layers and directed toward opposite sides of the at least one intermediate layer of the structural reinforcement material;
   disposing first and second electrical buses at least partially between the layers of the structural reinforcement material and extending along the structural member, the first and second buses being electrically isolated by a material disposed therebetween;
   connecting a first electrode to at least one of the buses and the first electrical device and thereby electrically connecting the first electrical device to at least one of the buses; and
   connecting a second electrode to at least one of the buses and the second electrical device and thereby electrically connecting the second electrical device to at least one of the buses, the second electrode providing a connection separate from the first electrode such that the first and second devices are separately electrically connected to the buses by the electrodes.

2. The method according to claim 1 further comprising disposing an elongate spacer between the first and second buses and thereby electrically isolating the first and second buses.

3. The method according to claim 1 wherein said first and second connecting steps comprise connecting the first bus to each of the first and second electrical devices, and further comprising electrically connecting the second bus to at least one of the first and second electrical devices.

4. The method according to claim 1 wherein said second disposing step comprises disposing the first and second buses generally parallel along a longitudinal direction of the structural member.

5. The method according to claim 1 wherein at least one of said connecting steps comprises disposing at least one of the electrodes through the intermediate layer of reinforcement material.

6. A method according to claim 5 wherein at least one of said connecting steps comprises providing an aperture through the intermediate layer of reinforcement material between the electrical devices and disposing at least one of the electrodes through the aperture of the intermediate layer.

7. The method according to claim 1 wherein said first and second disposing steps comprise disposing the electrical devices generally parallel to a first plane and disposing the buses generally in a second plane that is oblique to the first plane, and wherein said connecting steps comprise disposing the electrodes in a curved path such that a first end of each electrode is generally parallel to the electrical devices and a second end of each electrode is generally parallel to the second plane of the buses.

8. The method according to claim 1 further comprising providing the electrodes, each electrode comprising a tow formed of a plurality of reinforcement fibers and a conductive coating thereon.

9. The method according to claim 1 further comprising providing the bus, the bus comprising a plurality of nonlinear tows extending generally in a longitudinal direction, each tow including a plurality of fibers, at least some of the fibers including an electrically conductive metal.

10. The method according to claim 1 further comprising providing the first and second electrodes defining different lengths.

11. The method according to claim 1 wherein said providing step comprises disposing the layers of the structural reinforcement material as composite laminate plies with a matrix material.

12. A method according to claim 1 wherein said first connecting step comprises disposing the first electrode to extend between the first bus and the first electrical device and said second connecting step comprises disposing the second electrode to extend between the first bus and the second electrical device, and further comprising disposing a third electrode extending between the second bus and one of the electrical devices.

13. A method of manufacturing a composite structural member with an integrated electrical circuit, the method comprising:

provided a plurality of layers of structural reinforcement material;

disposing first and second electrical devices at least partially between the layers of the structural reinforcement material with at least one intermediate layer of the structural reinforcement material disposed between the electrical devices so that the electrical devices are disposed in different layers and directed toward opposite sides of the at least one intermediate layer of the structural reinforcement material;

disposing first and second electrical buses at least partially between the layers of the structural reinforcement material and extending along the structural member;

disposing an elongate spacer between the first and second buses and thereby electrically isolating the first and second buses;

connecting a first electrode to the first bus and the first electrical device and thereby electrically connecting the first electrical device to the first bus;

connecting a second electrode to the second bus and the second electrical device and thereby electrically connecting the second electrical device to the second bus;

connecting a third electrode to the first bus and the second electrical device and thereby electrically connecting the second electrical device to the first bus; and connecting a fourth electrode to the second bus and the first electrical device and thereby electrically connecting the first electrical device to the second bus, wherein each of the electrodes provides an electrically isolated connection between a respective electrode and bus such that the first and second devices are separately electrically connected to each of the first and second buses by the electrodes.

14. The method according to claim 13 wherein said second disposing step comprises disposing the first and second buses generally parallel along a longitudinal direction of the structural member.

15. The method according to claim 13 wherein at least one of said connecting steps comprises disposing at least one of the electrodes through the intermediate layer of reinforcement material.

16. The method according to claim 15 wherein at least one of said connecting steps comprises providing an aperture through the intermediate layer of reinforcement material between the electrical devices and disposing at least one of the electrodes through the aperture of the intermediate layer.

17. The method according to claim 13 wherein said first and second disposing steps comprise disposing the electrical devices generally parallel to a first plane and disposing the buses generally in a second plane that is oblique to the first plane, and wherein said connecting steps comprise disposing the electrodes in a curved path such that a first end of each electrode is generally parallel to the electrical devices and a second end of each electrode is generally parallel to the second plane of the buses.

18. The method according to claim 13 further comprising providing the electrodes, each electrode comprising a tow formed of a plurality of reinforcement fibers and a conductive coating thereon.

19. The method according to claim 13 further comprising providing the buses, each bus comprising a plurality of nonlinear tows extending generally in a longitudinal direction, each tow including a plurality of fibers, at least some of the fibers including an electrically conductive metal.

20. The method according to claim 13 further comprising providing the first and second electrodes defining different lengths and providing the third and fourth electrodes defining different lengths.

21. The method according to claim 13 wherein said providing step comprises disposing the layers of the structural reinforcement material as composite laminate plies with a matrix material.

* * * * *